(12) United States Patent
Hamano et al.

(10) Patent No.: US 12,184,052 B2
(45) Date of Patent: Dec. 31, 2024

(54) CIRCUIT ASSEMBLY AND ELECTRICAL JUNCTION BOX

(71) Applicant: Sumitomo Wiring Systems, Ltd., Yokkaichi (JP)

(72) Inventors: Shinya Hamano, Yokkaichi (JP); Yoshikazu Sasaki, Yokkaichi (JP); Junya Aichi, Yokkaichi (JP); Jun Ikeda, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 279 days.

(21) Appl. No.: 17/811,388

(22) Filed: Jul. 8, 2022

(65) Prior Publication Data

US 2023/0009555 A1 Jan. 12, 2023

(30) Foreign Application Priority Data

Jul. 8, 2021 (JP) .................................. 2021-113280

(51) Int. Cl.
| | | |
|---|---|---|
| *H02G 5/04* | (2006.01) | |
| *H02G 3/16* | (2006.01) | |
| *H05K 1/02* | (2006.01) | |
| *H05K 1/05* | (2006.01) | |
| *H05K 1/18* | (2006.01) | |
| *H05K 3/00* | (2006.01) | |
| *H05K 3/30* | (2006.01) | |
| *H05K 5/00* | (2006.01) | |

(52) U.S. Cl.
CPC ................ *H02G 5/04* (2013.01); *H02G 3/16* (2013.01); *H05K 2201/09936* (2013.01)

(58) Field of Classification Search
CPC .......... H02G 5/04; H02G 3/16; H05K 5/0026; H05K 2201/09936; H05K 2201/09918; H05K 1/0269; H05K 1/05; H05K 1/18
See application file for complete search history.

(56) References Cited

U.S. PATENT DOCUMENTS

| | | | | |
|---|---|---|---|---|
| 4,959,018 | A | * | 9/1990 | Yamamoto .......... H01R 13/5227 174/559 |
| 2011/0127675 | A1 | * | 6/2011 | Ewe ..................... H01L 25/0655 257/773 |
| 2018/0006441 | A1 | * | 1/2018 | Sumida ............... H05K 7/20418 |
| 2018/0242486 | A1 | * | 8/2018 | Sugita .................. H05K 13/089 |
| 2020/0266325 | A1 | * | 8/2020 | Wu ........................ H05K 1/181 |

FOREIGN PATENT DOCUMENTS

| | | | |
|---|---|---|---|
| JP | 2007-027510 A | | 2/2007 |
| JP | 2019161100 A | * | 9/2019 |

* cited by examiner

*Primary Examiner* — Hoa C Nguyen
*Assistant Examiner* — Amol H Patel
(74) *Attorney, Agent, or Firm* — Honigman LLP

(57) ABSTRACT

The present disclosure enables a cost reduction for a circuit assembly including electronic components. A circuit assembly includes: an electronic component; a conductive plate to which the electronic component is connected; and a holding member that holds the conductive plate. The conductive plate includes a mounting portion on which the electronic component is mounted, and a fiducial mark for positioning and mounting the electronic component. The fiducial mark is constituted by a hole formed in the conductive plate.

7 Claims, 6 Drawing Sheets

CIRCUIT ASSEMBLY AND ELECTRICAL JUNCTION BOX

CROSS-REFERENCE TO RELATED APPLICATIONS

This application claims priority of Japanese Patent Application No. JP 2021-113280 filed on Jul. 8, 2021, the contents of which are incorporated herein.

TECHNICAL FIELD

The present disclosure relates to a circuit assembly and an electrical junction box.

BACKGROUND

To mount electronic components on a substrate, fiducial marks are provided on the substrate, and a mounter uses the fiducial marks to position and mount the electronic components on the substrate. Fiducial marks are formed on a substrate by, for example, printing (see, e.g., JP 2007-27510A). Fiducial marks are also referred to as "positioning marks".

An electrical junction box may be provided on a wiring route connecting electrical devices, and the electrical junction includes a circuit assembly having electronic components. The circuit assembly includes a substrate to which the electronic components are connected, and a resin holding member (case) that holds the substrate. In this circuit assembly, fiducial marks as described above are used to mount the electronic components. If a wiring pattern is to be formed on the substrate by printing, it is possible to form the fiducial marks, together with the wiring pattern, by printing.

However, if the electronic components are to be connected to, instead of a substrate on which a wiring pattern is formed, a conductive plate (busbar) that does not have any wiring pattern, an additional process needs to be provided to add fiducial marks to the conductive plate using a laser. Note that, also if fiducial marks are to be added to a substrate on which a wiring pattern is formed, by using a laser for example, an additional process needs to be provided to perform this processing. This may result in cost increases for the circuit assembly and the electrical junction box including the circuit assembly.

Thus, it is an object of the present disclosure to provide a novel technical tool that enables a cost reduction for a circuit assembly including electronic components.

SUMMARY

According to an aspect of the present disclosure, a circuit assembly includes: an electronic component; a conductive plate to which the electronic component is connected; and a holding member that holds the conductive plate. The conductive plate includes a mounting portion on which the electronic component is mounted, and a fiducial mark for positioning and mounting the electronic component. The fiducial mark is constituted by a hole formed in the conductive plate.

According to an aspect of the present disclosure, an electrical junction box includes the above-described circuit assembly, and a cover that covers the circuit assembly.

Advantageous Effects

According to the present disclosure, the circuit assembly includes a fiducial mark for mounting an electronic component, but no additional process for adding the fiducial mark is needed, making it possible to reduce the cost of the circuit assembly.

DETAILED DESCRIPTION OF PREFERRED EMBODIMENTS

Figure 1:
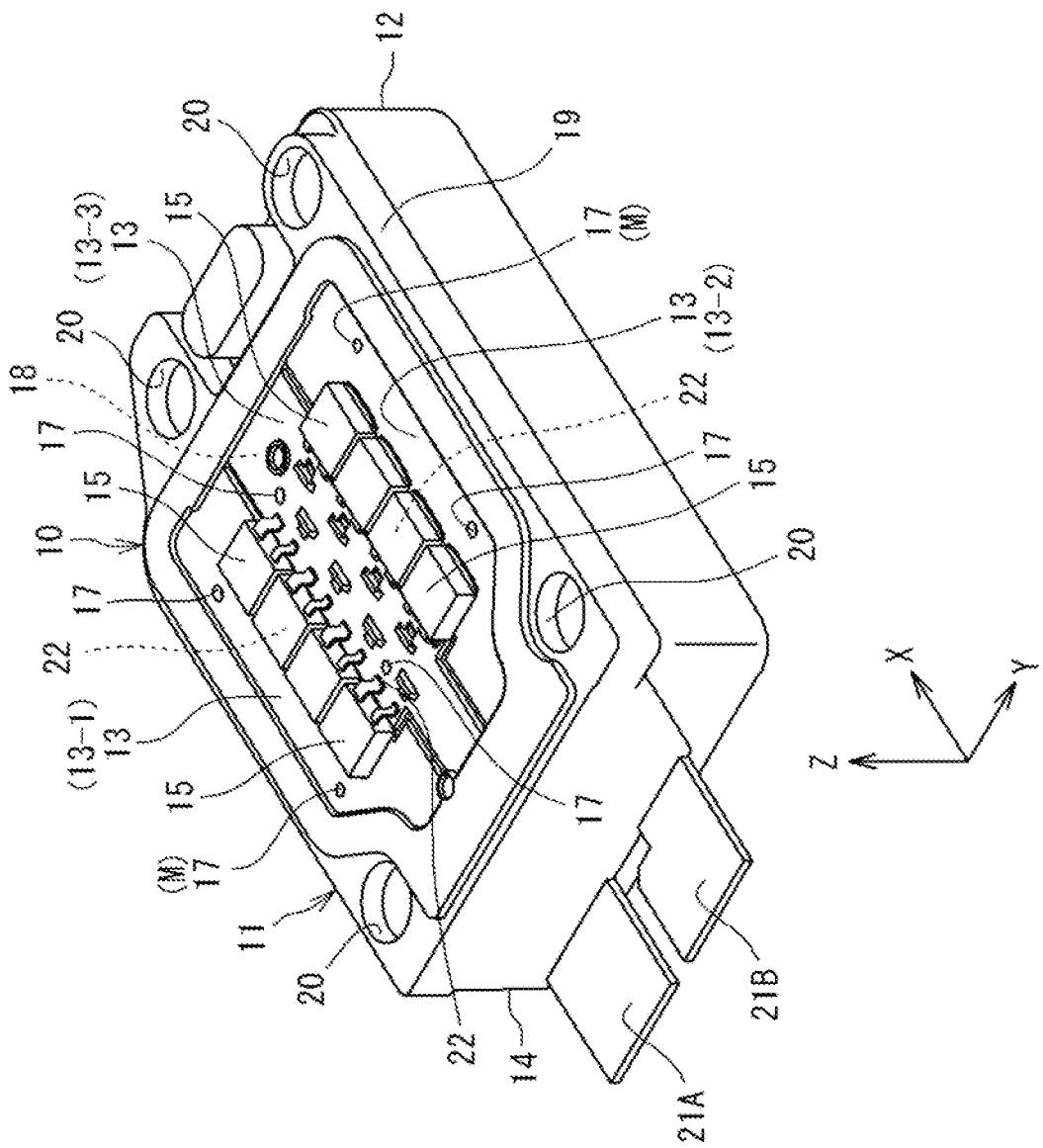
FIG. 1 is a perspective view illustrating an electrical junction box with a circuit assembly according to an embodiment.

First, overviews of an embodiment of the present disclosure will be listed and described.

First Aspect

A circuit assembly according to a first aspect includes: an electronic component; a conductive plate to which the electronic component is connected; and a holding member that holds the conductive plate, wherein the conductive plate includes a mounting portion on which the electronic component is mounted, and a fiducial mark for positioning and mounting the electronic component, and the fiducial mark is constituted by a hole formed in the conductive plate.

For example, the conductive plate can be manufactured by pressing and punching a metal plate, and the hole can be simultaneously formed in the metal plate by this punching processing, thus making it possible to obtain the conductive plate having the fiducial mark. By mounting the electronic component on the conductive plate, the circuit assembly of the present embodiment is obtained. That is to say, according to the circuit assembly of the present embodiment, no additional process for adding a fiducial mark M is needed, and it is possible to reduce the cost of the circuit assembly.

Second Aspect

In a second aspect, the holding member is made of a resin, and the conductive plate and the holding member are formed as one piece with the conductive plate partially buried in the holding member. In this case, by placing the conductive plate having the hole in a die, and supplying a molten resin into the die (that is to say, by performing insert molding), a configuration in which the conductive plate is held by the holding member can be obtained.

Third Aspect

In a third aspect, according to the circuit assembly of the second aspect, by inserting a support member of the die, such as a pin, into the hole of the conductive plate, the conductive plate can be positioned and placed at a predetermined position of the die. Therefore, if the circuit assembly includes a plurality of conductive plates, preferably, the plurality of conductive plates are held by the holding member, and each of the conductive plates is provided with a hole.

With this configuration, it is possible to support the conductive plates using support members of the die, such as pins. The hole used as the fiducial mark is also used to position the conductive plate in the die when the holding member is molded. Note that not all of the holes formed in the conductive plates are necessarily used as the fiducial marks.

Fourth Aspect

In a fourth aspect, the circuit assembly of the second or third aspect, preferably, each conductive plate is provided with a plurality of holes. In this case, by respectively inserting the support members of the die, such as the pins, into the plurality of holes formed in the conductive plate, the orientation of the conductive plates becomes more stable.

Fifth Aspect

Preferably, a plurality of holes serve as fiducial marks and are provided while being distanced from each other. In this case, the accuracy of positioning of electronic components increases. This is specifically preferable when, in order to mount electronic components, the electronic components are positioned using numerical control based on plane coordinates.

Sixth Aspect

In the circuit assembly of the above-described item (5), preferably, a plurality of conductive plates are held by the holding member, and a first conductive plate has one of the holes serving as the fiducial marks, and a second conductive plate has another hole serving as the fiducial mark. With this configuration, the plurality of holes serving as the fiducial marks are distanced from each other, and the accuracy of positioning of the electronic components with respect to both the first and second conductive plates.

Seventh Aspect

Also, in the circuit assembly of the above-described items (2) to (4), when, during insert molding, the support member of the die such as the pin is inserted into a hole of the conductive plate, a molten resin may flow out to a region opposite to a resin-supplied region with the conductive plate interposed therebetween, via a space between the hole and the pin. Therefore, the holding member made of a molten resin preferably has the following configurations.

That is, the holding member may include a base portion that is plate-shaped and is provided along the conductive plate, and the base portion may include an opening that exposes a region that includes the hole and an area surrounding the hole.

In this case, when the molten resin is supplied with a part of the die being in contact with the conductive plate in the portion that corresponds to the opening, the molten resin is not likely to reach the space between the pin and the hole, and it is possible to prevent the molten resin from flowing out.

Eighth Aspect

An electrical junction box according to the present embodiment includes: the circuit assembly according to any one of the items (1) to (7); and a cover that covers the circuit assembly. According to the electrical junction box of the present embodiment, no additional process for adding a fiducial mark is needed, and it is possible to reduce the cost of the circuit assembly.

The following will describe details of the embodiment of the present disclosure with reference to the drawings. Note that at least some features of the embodiment described below may be combined with each other as appropriate.

Regarding Electrical Junction Box 10

FIG. 1 is a perspective view illustrating an electrical junction box 10 with a circuit assembly 11 according to the present embodiment. The electrical junction box 10 can be installed in various devices, and in the present embodiment, the electrical junction box 10 is installed in an automobile. More specifically, the electrical junction box 10 is provided on a not-shown wiring route connecting a first on-board device and a second on-board device. The electrical junction box 10 includes the circuit assembly 11, and a cover 12 that covers the circuit assembly 11. The cover 12 is made of metal (aluminum or an aluminum alloy), and has a heat dissipation function of dissipating heat generated in the circuit assembly 11. The electrical junction box 10 may further include another unit (not shown) attached to the circuit assembly 11 on a side opposite to the cover 12.

Regarding Circuit Assembly 11

The circuit assembly 11 includes a plurality of electronic components 15, a plurality of conductive plates 13, and a single holding member 14.

The electronic components 15 are, for example, semiconductor relays such as field effect transistors (FETs). Each electronic component 15 includes a plurality of terminals (a first terminal, a second terminal, and a third terminal), and the terminals are connected to the conductive plates 13 by solder or the like. The electronic components 15 may also be other components, and examples thereof include mechanical relays, resistors, coils, and capacitors. The electronic components 15 are electrically connected to the conductive plates 13.

Each conductive plate 13 is manufactured by pressing a metal plate into a predetermined shape. The conductive plate 13 is a piece of metal plate, and is referred to also as a busbar. The conductive plate 13 is preferably a member made of copper such as pure copper or a copper alloy, for example. The entirety of the conductive plate 13 is a conductor, and the conductive plate 13 does not have any wiring pattern as formed on a typical printed circuit board. The circuit assembly 11 shown in FIG. 1 includes a first conductive plate 13-1, a second conductive plate 13-2, and a third conductive plate 13-3. Each of the conductive plates 13 has a thickness that is smaller than its width. The thickness of the conductive plates 13 varies depending on the circuit assembly 11, and is at least 1 millimeter and at most 2 millimeters, for example. In the present embodiment, the thickness of the conductive plates 13 is 1.5 millimeters.

The holding member 14 is made of a thermoplastic resin, and is molded by injection molding. In the present embodiment, as will be described later, the holding member 14 is manufactured by insert molding that is performed with the conductive plates 13 placed in a die for injection molding. With this, the conductive plates 13 and the holding member 14 are formed as one piece with the conductive plates 13 partially buried in the holding member 14. The holding member 14 is made of, for example, polyphenylene sulfide (PPS), polybutylene terephthalate (PBT), nylon, polypropylene (PP), polyethylene (PE), or the like, and has insulating properties. The holding member 14 holds the three conductive plates 13, and functions as a case of the circuit assembly 11.

The holding member 14 includes a plate-shaped base portion 18 provided in the center of the holding member 14, and a frame portion 19 provided surrounding the base portion 18. Main portions 22 of the conductive plates 13 on which the electronic components 15 are mounted are provided on the base portion 18. The main portions 22 of the three conductive plates 13 are arranged side by side in a flat manner on the base portion 18 without overlapping each other. The frame portion 19 has fixation holes 20 used to fix the cover 12 thereto. An end portion 21A of the first conductive plate 13-1 and an end portion 21B of the second conductive plate 13-2 protrude outward from the frame portion 19. Not-shown cables or the like can be connected to the end portions 21A and 21B.

Figure 2:
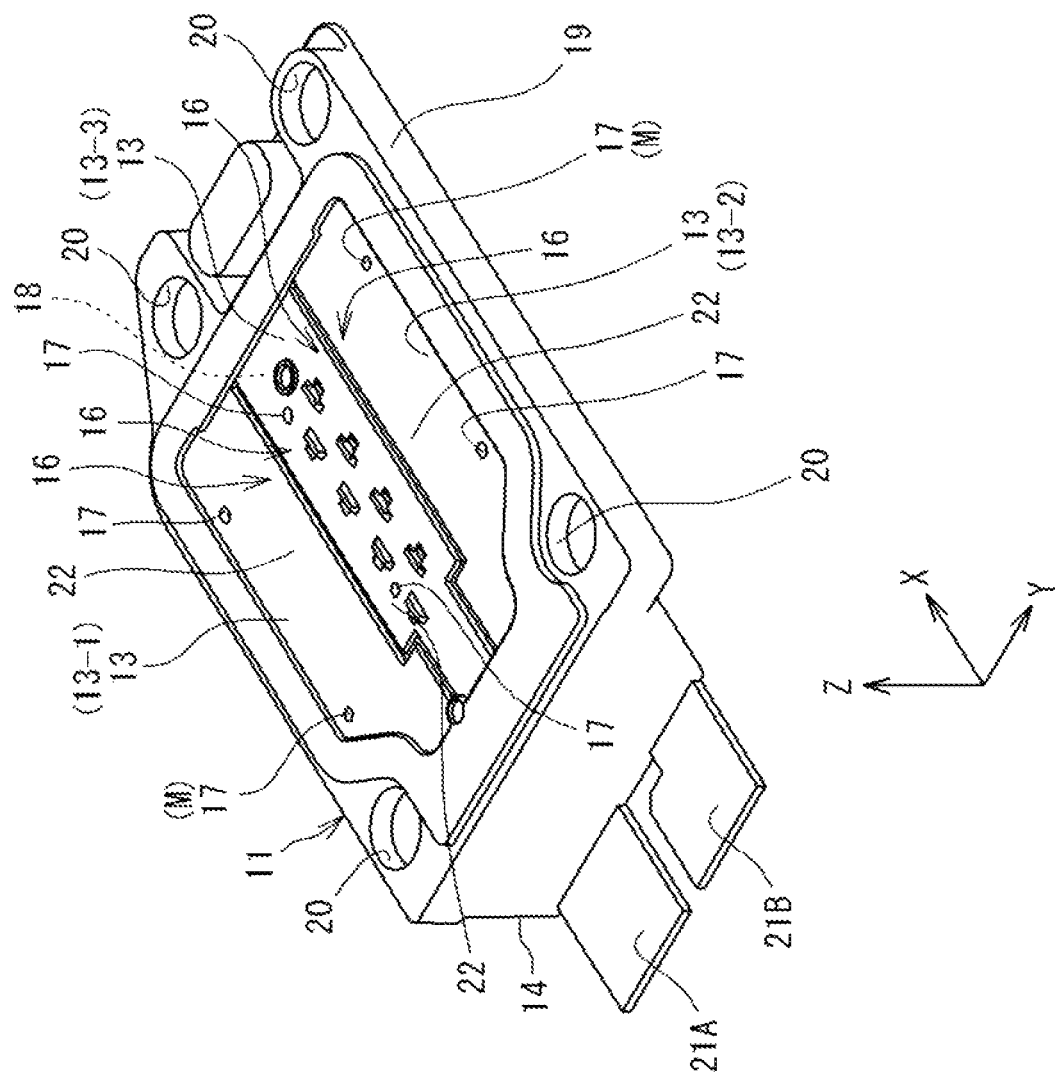
FIG. 2 is a perspective view illustrating the circuit assembly before electronic components are mounted.

FIG. 2 is a perspective view illustrating the circuit assembly 11 before the electronic components 15 are mounted. As shown in FIGS. 1 and 2, the conductive plates 13 have mounting portions 16 on which the electronic components 15 are mounted. The mounting portions 16 are portions of the main portions 22 of the conductive plates 13 on which the electronic components 15 are laid. The electronic components 15 are provided over two adjacent conductive plates 13.

When an X-Y plane coordinate system is set along a plane that includes the surface of the conductive plates 13 (the main portions 22), the direction along which the plurality of conductive plates 13 are arranged side by side is defined as "Y direction", and a direction that is orthogonal to the Y direction is defined as "X direction". When a direction that is orthogonal to both the X direction and the Y direction is defined as "Z direction", a three-dimensional coordinate system is defined with the X, Y, and Z directions. The conductive plates 13 are held by the holding member 14 such that the longitudinal direction of the conductive plates 13 matches the X direction. In a mode shown in FIG. 1, four electronic components 15 are lined up in the X direction in a first line on one side in the Y direction, and other four electronic components 15 are lined up in the X direction in a second line on the other side in the Y direction. The widths of the conductive plates 13 are their dimensions in the Y direction, and the thicknesses of the conductive plates 13 are their dimensions in the Z direction.

The conductive plates 13 include fiducial marks M provided on regions other than the mounting portions 16. The fiducial marks M are used to position and mount the electronic components 15 on the conductive plates 13. The fiducial marks M are also referred to as "positioning marks". The fiducial marks M are constituted by holes 17 formed in the conductive plates 13. The holes 17 penetrate the conductive plates 13. The holes 17 are formed in the three conductive plates 13.

Figure 6:
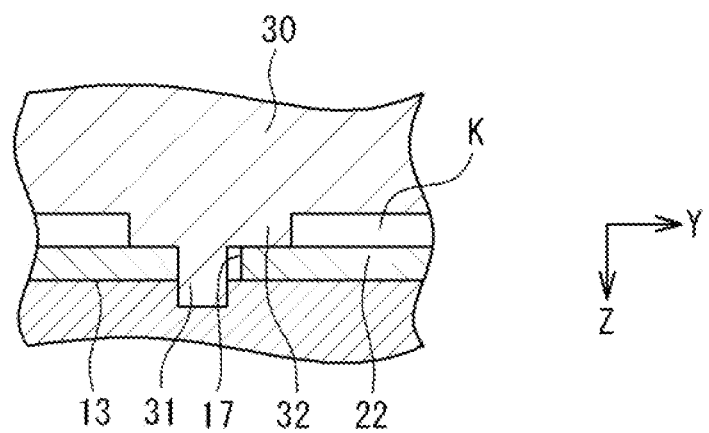
FIG. 6 is an enlarged cross-sectional view illustrating a conductive plate and a die for insert molding.

A plurality of holes 17 are formed in each of the conductive plates 13, and in the present embodiment, two holes 17 are formed in each of the conductive plates 13. As described above, the holding member 14 is manufactured by insert molding that is performed with the conductive plates 13 placed in a die. At this time, the conductive plates 13 need to be positioned and placed in the die. Therefore, by inserting a pin (support member) 31, which is a part of a die 30 (see FIG. 6), in the two holes 17 formed in each of the conductive plates 13, the conductive plates 13 are supported at two points, and their orientation in the die 30 becomes more stable. FIG. 6 is an enlarged cross-sectional view illustrating parts of one conductive plate 13 and the die 30 for insert molding. The diameter of the holes 17 is preferably greater than or equal to the thickness of the conductive plates 13. For example, the thickness of the conductive plates 13 may be 1.5 millimeters, and the diameter of the holes 17 may be 2 millimeters.

In the circuit assembly 11 shown in FIG. 1, six holes 17 in total are formed, and two of the six holes 17 are used as the fiducial marks M. The two holes 17 used as the fiducial marks M are also used to position the conductive plates 13 in the die 30 when performing the insert molding. The remaining four holes 17 are not used as fiducial marks M, but are used to position the conductive plates 13 in the die 30 when performing the insert molding.

Figure 3:
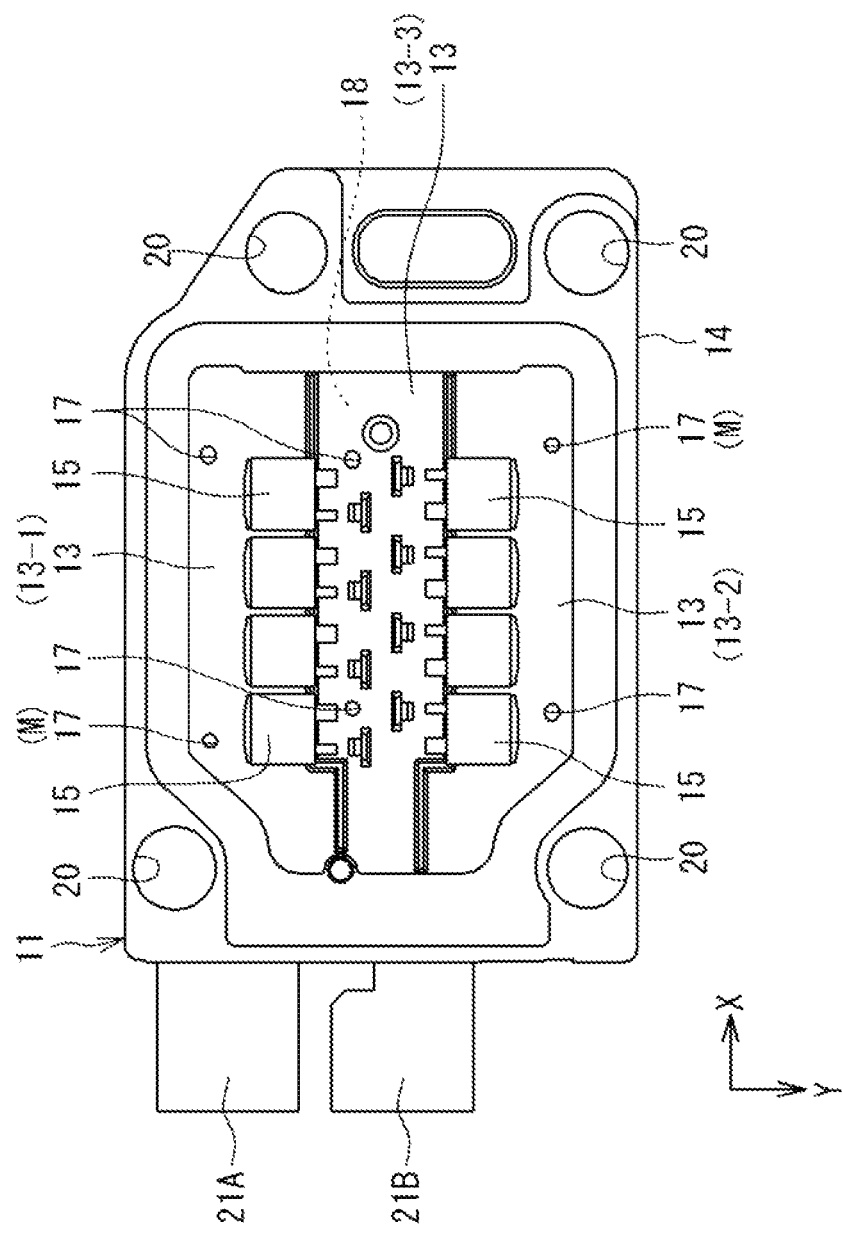
FIG. 3 is a plan view illustrating the circuit assembly.

FIG. 3 is a plan view illustrating the circuit assembly 11. The following will describe the two holes 17 that are used as the fiducial marks M. The holes 17 serving as the fiducial marks M are formed in the first conductive plate 13-1 located on one side (upper side in FIG. 3) in the Y direction, and in the second conductive plate 13-2, which is different from the first conductive plate 13-1, and is located on the other side (lower side in FIG. 3) in the Y direction. More specifically, the hole 17 formed in a region of the first conductive plate 13-1 on one side (left side in FIG. 3) in the X direction, and the hole 17 formed in a region of the second conductive plate 13-2 on the other side (right side in FIG. 3) in the X direction serve as the fiducial marks M. Thus, two holes 17 distanced in both the X direction and the Y direction are used as the fiducial marks M. The two holes 17 formed in the third conductive plate 13-3 are not used as fiducial marks M.

Figure 4:
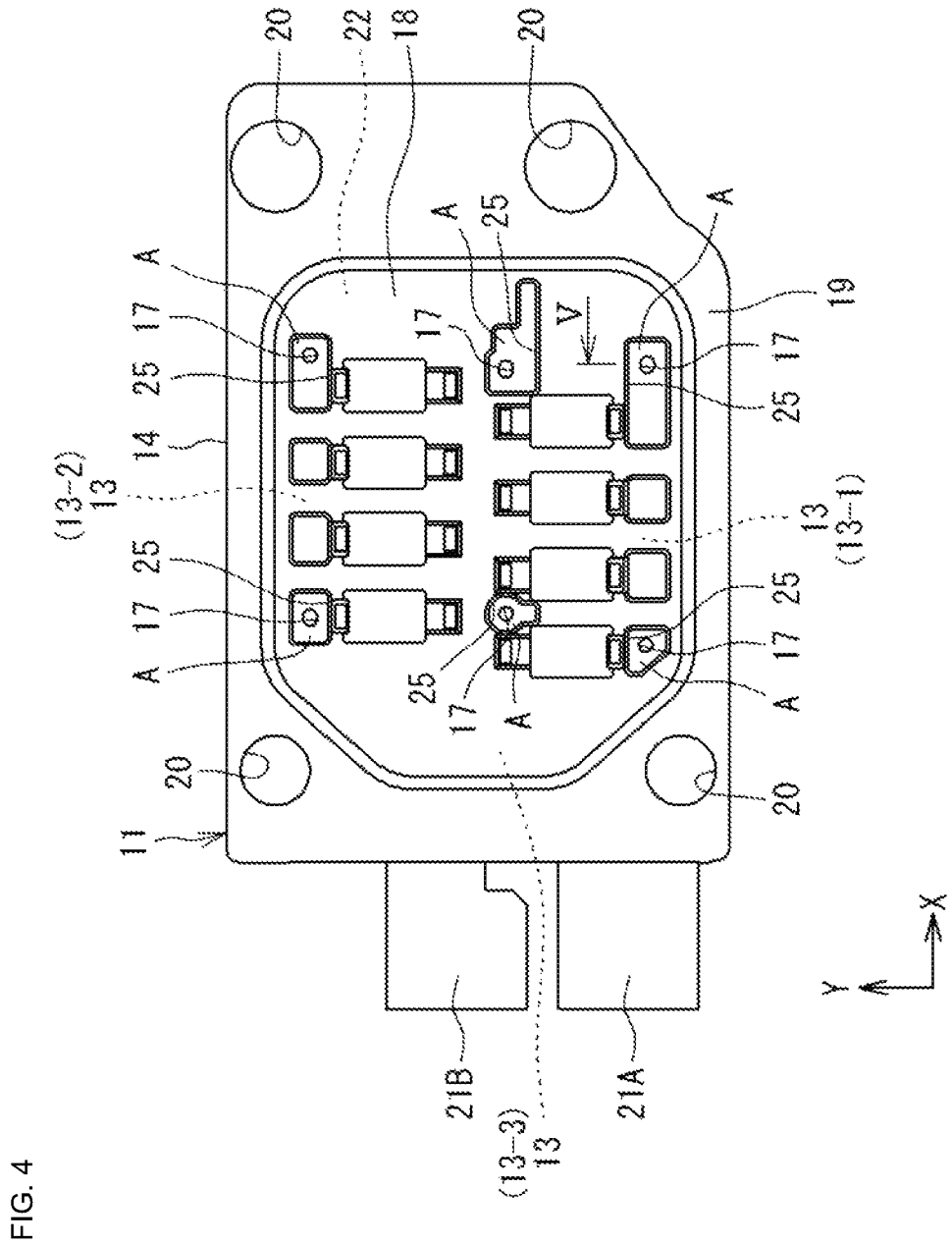
FIG. 4 is a bottom view illustrating the circuit assembly.
Figure 5:
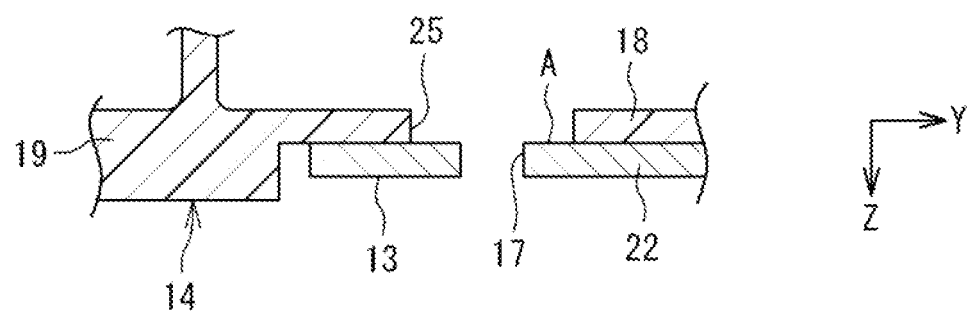
FIG. 5 is a cross-sectional view taken along a line indicated by an arrow V in FIG. 4.

FIG. 4 is a bottom view of the circuit assembly 11. As described above, the holding member 14 includes the plate-shaped base portion 18, and the frame portion 19 provided surrounding the base portion 18. The base portion 18 and the frame portion 19 are molded as one piece by injection molding. FIG. 5 is a cross-sectional view taken along a line indicated by an arrow V in FIG. 4. The base portion 18 is a portion provided along the main portion 22 of the conductive plate 13. FIG. 5 shows a state in which the base portion 18 and the conductive plate 13 (main portion 22) overlap each other in the Z direction. As shown in FIGS. 4 and 5, the base portion 18 includes openings 25 that each expose a region A that includes a hole 17 formed in the conductive plate 13 and an area surrounding the hole 17. The openings 25 are partially lost parts formed in the plate-shaped base portion 18.

As shown in FIG. 4, the openings 25 are provided for all the regions A that respectively includes the holes 17 and the areas surrounding the holes 17. The openings 25 have a variety of outline shapes set according to the shapes of the surrounding areas of the openings 25. Each of the openings 25 is generated by a projection-shaped portion 32 of the die 30 (see FIG. 6) when the insert molding is performed.

As shown in FIG. 6, the projection-shaped portion 32 of the die 30 has the pin 31 in the center thereof, and an area surrounding the pin 31 is in surface-contact with the conductive plate 13 when the insert molding is performed. A molten resin is supplied into a cavity that includes a space K surrounding the projection-shaped portion 32. As a result of the molten resin becoming solidified, the holding member 14 is obtained. As shown in FIG. 5, a portion of the base portion 18 of the holding member 14 that corresponds to the projection-shaped portion 32 (see FIG. 6) serves as the opening 25 for exposing the region A that includes a hole 17 and an area surrounding the hole 17. The openings 25 are formed in the holding member 14 by the projection-shaped portions 32 of the die 30.

In this manner, the molten resin is supplied with the projection-shaped portion 32, which is a part of the die, being in contact with the conductive plate 13 in the portion that corresponds to the opening 25. Therefore, the molten resin is not likely to reach a space between the pin 31 and the hole 17, and it is possible to prevent the molten resin from flowing out to a region opposite to the resin-supplied region with the conductive plate 13 interposed therebetween. Specifically, if the hole 17 is an elongated hole, a gap is formed between the elongated hole and the pin 31. The resin is likely to flow out via this gap. However, when the projection-shaped portion 32 is in contact with the conductive plate 13, the resin can be prevented from flowing out.

In FIG. 3, the holes 17 have any shape, but the holes 17 that serve as the fiducial marks M preferably have a true-circle shape. The conductive plates 13 are manufactured by pressing and punching a metal plate, and the holes 17 are simultaneously formed by this punching processing. If the diameter of a hole 17 is small and is not greater than the thickness of the corresponding conductive plate 13, the die (punch) that punches the hole 17 is thin and the formation of the hole 17 is difficult. Therefore, in the present embodiment, the diameter of the holes 17 is set to be at least the thickness of the conductive plates 13, and thus the formation of the holes 17 is relatively easy.

Two holes 17 are formed in each of the conductive plates 13, and one of the two holes 17 formed in one conductive plate 13 may be circular, and the other hole 17 may have a shape larger than this circular shape. For example, the other hole 17 may be oval or long hole-shaped, and the oval or long hole shape has the same short diameter as the diameter of the one hole 17. Note that, in the following description, the diameter of an oval or long hole refers to the short diameter thereof.

This is because, when the holding member 14 is molded by insert molding, the conductive plates 13 are arranged in the die 30 as described above (see FIG. 6). That is to say, the conductive plates 13 need to be positioned and placed in the die 30, and thus the pin 31, which is a part of the die 30, is inserted into each of the two holes 17 formed in each conductive plate 13. Preferably, the cross-sectional shape of the pin 31 matches the shape of the hole 17. However, if the shape of the two holes 17 matches the cross-sectional shape of the pin 31, it may be difficult to perform the operation of inserting two pins 31 into the two holes 17, due to a manufacturing error. Therefore, one of the two holes 17 has the same hole shape (true circle shape) as the cross-sectional shape of the pins 31, and, as shown in FIG. 6, the other one of the holes 17 has a hole shape (oval or long hole shape) larger than the cross-sectional shape of the pins 31. This makes it easy to perform the operation of inserting the two pins 31 into the two holes 17 formed in each conductive plate 13.

Regarding Circuit Assembly 11 of Present Embodiment

The circuit assembly 11 (see FIGS. 1 and 2) of the present embodiment includes the electronic components 15, the conductive plates 13 to which the electronic components 15 are connected, and the holding member 14 that holds the conductive plates 13. The conductive plates 13 include the mounting portions 16 on which the electronic components 15 are mounted, and the fiducial marks M used to position and mount the electronic components 15. The fiducial marks M are each constituted by one of the holes 17 formed in the conductive plate 13.

In the present embodiment, the conductive plates 13 are manufactured by pressing and punching a metal plate, and the holes 17 are simultaneously formed in the metal plate by this punching processing. With this, the conductive plates 13 having the fiducial marks M are obtained. By mounting the electronic components 15 on the conductive plates 13, the circuit assembly 11 is obtained. That is to say, according to the circuit assembly 11 of the present embodiment, no additional process for adding the fiducial marks M is needed, and it is possible to reduce the cost of the circuit assembly 11. As a result, it is possible to reduce the cost of the electrical junction box 10 including the circuit assembly 11.

The holding member 14 is made of a thermoplastic resin, and is manufactured by insert molding. The conductive plates 13 and the holding member 14 are formed as one piece with the conductive plates 13 partially buried in the holding member 14. That is to say, it is possible to obtain a configuration in which the conductive plates 13 having the holes 17 are held by the holding member 14, by placing the conductive plates 13 in the die and supplying a molten resin into the die.

In the insert molding, by inserting the pin 31 of the die 30 into the hole 17 of the conductive plate 13 as shown in FIG. 6, it is possible to position and place the conductive plate 13 at a predetermined position of the die 30. Here, in the present embodiment, three conductive plates 13 are held by the holding member 14, and each of the three conductive plates 13 has holes 17. Holes 17 used as a fiducial marks M are also used to position the conductive plates 13 in the die 30 when the holding member 14 is molded. Furthermore, in the present embodiment, one conductive plate 13 has two holes 17. By inserting a pin 31 into each of the two holes 17 formed in the conductive plate 13, the orientation of the conductive plate 13 becomes more stable.

In the present embodiment, when the electronic components 15 are mounted, two of the six holes 17 in total are used as the fiducial marks M. Note that a configuration is also possible in which, when the electronic components 15 are mounted, some of the six holes 17 in total, namely, at least two holes 17 are used as the fiducial marks M, and the remaining holes 17 are not used as the fiducial marks M. For example, if three holes 17 are used as the fiducial marks M, two holes 17 can be used as the basis of positioning, and the remaining one hole 17 can be used for correction. Thus, not all of the holes 17 formed in the conductive plates 13 are necessarily used as the fiducial marks M.

The holes 17 serving as the fiducial marks M are distanced from each other in both the X direction and the Y direction. When mounting the electronic components 15, numerical control is performed based on an X-Y plane coordinate system to position the electronic components 15. Using the two holes 17 distanced from each other as the fiducial marks M increases the accuracy of the positioning of the electronic components 15.

Other Configurations

In the present embodiment, although the conductive plates 13 are partially buried in the holding member 14 made of a resin, that is, the holding member 14 is an insert-molded article with which the conductive plates 13 are formed as one piece, a configuration in which the holes 17 of the conductive plates 13 are used as the fiducial marks M is also applicable to conductive plates 13 that are not insert-molded articles. The numbers and layouts of the conductive plates 13 and the electronic components 15 may be different to those shown in the drawings. The holes 17 used as the fiducial marks M are also set at appropriate positions.

The above-described embodiments are examples in all respects, and are non-limiting. The claimed scope of the present disclosure is indicated by not the above-described embodiments but the claims, and includes all modifications within the scope equivalent to the scope of the claims.

What is claimed is:

1. A circuit assembly comprising:
an electronic component;
a conductive plate to which the electronic component is connected; and
a holding member that holds the conductive plate,
wherein the conductive plate includes a mounting portion on which the electronic component is mounted, and a fiducial mark for positioning and mounting the electronic component, and
the fiducial mark is constituted by a hole formed in the conductive plate; and wherein the holding member includes a base portion that is plate-shaped and is provided along the conductive plate, and the base portion includes an opening that exposes a region that includes the hole and an area surrounding the hole.

2. The circuit assembly according to claim 1, wherein the holding member is made of a resin, and the conductive plate and the holding member are formed as one piece with the conductive plate partially buried in the holding member.

3. The circuit assembly according to claim 2, wherein a plurality of conductive plates are held by the holding member, and each of the conductive plates is provided with a hole.

4. The circuit assembly according to claim 2, wherein the conductive plate is provided with a plurality of holes.

5. The circuit assembly according to claim 1, wherein a plurality of holes serve as fiducial marks and are provided while being distanced from each other.

6. The circuit assembly according to claim 5, wherein a plurality of conductive plates are held by the holding member, and a first conductive plate has one of the holes serving as the fiducial marks, and a second conductive plate has another hole serving as the fiducial mark.

7. An electrical junction box comprising:

the circuit assembly according to claim 1; and a cover that covers the circuit assembly.

* * * * *